(12) United States Patent
Akram et al.

(10) Patent No.: US 7,683,458 B2
(45) Date of Patent: Mar. 23, 2010

(54) THROUGH-WAFER INTERCONNECTS FOR PHOTOIMAGER AND MEMORY WAFERS

(75) Inventors: Salman Akram, Boise, ID (US);
Charles M. Watkins, Eagle, ID (US);
William M. Hiatt, Eagle, ID (US);
David R. Hembree, Boise, ID (US);
James M. Wark, Boise, ID (US);
Warren M. Farnworth, Nampa, ID (US); Mark E. Tuttle, Boise, ID (US);
Sidney B. Rigg, Meridian, ID (US);
Steven D. Oliver, Boise, ID (US); Kyle K. Kirby, Eagle, ID (US); Alan G. Wood, Boise, ID (US); Lu Velicky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 11/924,781

(22) Filed: Oct. 26, 2007

(65) Prior Publication Data

US 2008/0111213 A1    May 15, 2008

Related U.S. Application Data

(62) Division of application No. 10/932,296, filed on Sep. 2, 2004, now Pat. No. 7,300,857.

(51) Int. Cl.
*H01L 23/485* (2006.01)
(52) U.S. Cl. ............... 257/621; 257/738; 257/E23.011
(58) Field of Classification Search ............... 438/667
See application file for complete search history.

(56) References Cited

U.S. PATENT DOCUMENTS

| 2,821,959 | A | 2/1958 | Franz |
| 3,006,318 | A | 10/1961 | Monroe, Jr. et al. |
| 3,345,134 | A | 10/1967 | Heymer et al. |
| 3,865,298 | A | 2/1975 | Allen et al. |
| 3,902,036 | A | 8/1975 | Zaleckas |
| 4,040,168 | A | 8/1977 | Huang |
| 4,368,106 | A | 1/1983 | Anthony |

(Continued)

FOREIGN PATENT DOCUMENTS

DE        10205026 C1    5/2003

(Continued)

OTHER PUBLICATIONS

Aachboun, S. and P. Ranson, "Cryogenic etching of deep narrow trenches in silicon," J. Vac. Sci. Technol. A 18(4), Jul./Aug. 2000, pp. 1848-1852.

(Continued)

*Primary Examiner*—Stephen W Smoot
(74) *Attorney, Agent, or Firm*—Perkins Coie LLP

(57) ABSTRACT

A through-wafer interconnect for imager, memory and other integrated circuit applications is disclosed, thereby eliminating the need for wire bonding, making devices incorporating such interconnects stackable and enabling wafer level packaging for imager devices. Further, a smaller and more reliable die package is achieved and circuit parasitics (e.g., L and R) are reduced due to the reduced signal path lengths.

17 Claims, 6 Drawing Sheets

U.S. PATENT DOCUMENTS

| | | |
|---|---|---|
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,768,291 A | 9/1988 | Palmer |
| 4,906,314 A | 3/1990 | Farnworth et al. |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,130,783 A | 7/1992 | McLellan |
| 5,145,099 A | 9/1992 | Wood et al. |
| 5,158,911 A | 10/1992 | Quentin |
| 5,219,344 A | 6/1993 | Yoder, Jr. |
| 5,233,448 A | 8/1993 | Wu et al. |
| 5,237,148 A | 8/1993 | Aoki et al. |
| 5,289,631 A | 3/1994 | Koopman et al. |
| 5,292,686 A | 3/1994 | Riley et al. |
| 5,294,568 A | 3/1994 | McNeilly et al. |
| 5,371,397 A | 12/1994 | Maegawa et al. |
| 5,378,312 A | 1/1995 | Gifford et al. |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,435,887 A | 7/1995 | Rothschild et al. |
| 5,438,212 A | 8/1995 | Okaniwa et al. |
| 5,447,871 A | 9/1995 | Goldstein |
| 5,464,960 A | 11/1995 | Hall et al. |
| 5,496,755 A | 3/1996 | Bayraktaroglu |
| 5,505,804 A | 4/1996 | Mizuguchi et al. |
| 5,515,167 A | 5/1996 | Ledger et al. |
| 5,518,956 A | 5/1996 | Liu et al. |
| 5,585,308 A | 12/1996 | Sardella |
| 5,585,675 A | 12/1996 | Knopf |
| 5,593,913 A | 1/1997 | Aoki |
| 5,605,783 A | 2/1997 | Revelli et al. |
| 5,614,743 A | 3/1997 | Mochizuki et al. |
| 5,618,752 A | 4/1997 | Gaul |
| 5,624,437 A | 4/1997 | Freeman et al. |
| 5,627,106 A | 5/1997 | Hsu |
| 5,646,067 A | 7/1997 | Gaul |
| 5,654,221 A | 8/1997 | Cronin et al. |
| 5,672,519 A | 9/1997 | Song et al. |
| 5,673,846 A | 10/1997 | Gruber |
| 5,684,642 A | 11/1997 | Zumoto et al. |
| 5,690,841 A | 11/1997 | Elderstig et al. |
| 5,694,246 A | 12/1997 | Aoyama et al. |
| 5,708,293 A | 1/1998 | Ochi et al. |
| 5,718,791 A | 2/1998 | Spengler et al. |
| 5,723,904 A | 3/1998 | Shiga et al. |
| 5,726,493 A | 3/1998 | Yamashita et al. |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,877,040 A | 3/1999 | Park et al. |
| 5,893,828 A | 4/1999 | Uram |
| 5,897,338 A | 4/1999 | Kaldenberg |
| 5,904,499 A | 5/1999 | Pace |
| 5,914,488 A | 6/1999 | Sone |
| 5,969,422 A | 10/1999 | Ting et al. |
| 5,977,535 A | 11/1999 | Rostoker |
| 5,998,240 A | 12/1999 | Hamilton et al. |
| 5,998,292 A | 12/1999 | Black et al. |
| 5,998,862 A | 12/1999 | Yamanaka |
| 6,004,867 A | 12/1999 | Kim et al. |
| 6,008,070 A | 12/1999 | Farnworth |
| 6,008,914 A | 12/1999 | Sasagawa et al. |
| 6,080,291 A | 6/2000 | Woodruff et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,180 A | 8/2000 | Munroe et al. |
| 6,107,679 A | 8/2000 | Noguchi et al. |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,180,518 B1 | 1/2001 | Layadi et al. |
| 6,184,060 B1 | 2/2001 | Siniaguine |
| 6,184,465 B1 | 2/2001 | Corisis |
| 6,187,615 B1 | 2/2001 | Kim et al. |
| 6,191,487 B1 | 2/2001 | Rodenbeck et al. |
| 6,203,539 B1 | 3/2001 | Shimmick et al. |
| 6,222,136 B1 | 4/2001 | Appelt et al. |
| 6,222,270 B1 | 4/2001 | Lee et al. |
| 6,228,687 B1 | 5/2001 | Akram et al. |
| 6,229,202 B1 | 5/2001 | Corisis |
| 6,235,552 B1 | 5/2001 | Kwon et al. |
| 6,236,046 B1 | 5/2001 | Watabe et al. |
| 6,246,108 B1 | 6/2001 | Corisis et al. |
| 6,252,300 B1 | 6/2001 | Hsuan et al. |
| 6,259,083 B1 | 7/2001 | Kimura |
| 6,266,197 B1 | 7/2001 | Glenn et al. |
| 6,268,114 B1 | 7/2001 | Wen et al. |
| 6,271,580 B1 | 8/2001 | Corisis |
| 6,274,927 B1 | 8/2001 | Glenn |
| 6,277,757 B1 | 8/2001 | Lin et al. |
| 6,285,064 B1 | 9/2001 | Foster |
| 6,291,894 B1 | 9/2001 | Farnworth et al. |
| 6,294,837 B1 | 9/2001 | Akram et al. |
| 6,297,155 B1 | 10/2001 | Simpson et al. |
| 6,324,253 B1 | 11/2001 | Yuyama et al. |
| 6,326,689 B1 | 12/2001 | Thomas |
| 6,326,697 B1 | 12/2001 | Farnworth |
| 6,329,632 B1 | 12/2001 | Fournier et al. |
| 6,341,009 B1 | 1/2002 | O'Connor et al. |
| 6,344,976 B1 | 2/2002 | Schoenfeld et al. |
| 6,351,027 B1 | 2/2002 | Giboney et al. |
| 6,359,254 B1 | 3/2002 | Brown |
| 6,359,328 B1 | 3/2002 | Dubin |
| 6,372,548 B2 | 4/2002 | Bessho et al. |
| 6,391,770 B2 | 5/2002 | Kosaki et al. |
| 6,406,636 B1 | 6/2002 | Vaganov |
| 6,407,381 B1 | 6/2002 | Glenn et al. |
| 6,411,439 B2 | 6/2002 | Nishikawa |
| 6,432,821 B1 | 8/2002 | Dubin et al. |
| 6,433,303 B1 | 8/2002 | Liu et al. |
| 6,437,284 B1 | 8/2002 | Okamoto et al. |

| | | |
|---|---|---|
| 6,437,441 B1 | 8/2002 | Yamamoto et al. |
| 6,441,487 B2 | 8/2002 | Elenius et al. |
| 6,452,270 B1 | 9/2002 | Huang et al. |
| 6,457,515 B1 | 10/2002 | Vafai et al. |
| 6,459,039 B1 | 10/2002 | Bezama et al. |
| 6,468,889 B1 | 10/2002 | Iacoponi et al. |
| 6,483,652 B2 | 11/2002 | Nakamura |
| 6,486,083 B1 | 11/2002 | Mizuno et al. |
| 6,486,549 B1 | 11/2002 | Chiang et al. |
| 6,503,780 B1 | 1/2003 | Glenn et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,541,762 B2 | 4/2003 | Knag et al. |
| 6,545,563 B1 | 4/2003 | Smith |
| 6,555,782 B2 | 4/2003 | Isaji et al. |
| 6,560,047 B2 | 5/2003 | Choi et al. |
| 6,566,745 B1 | 5/2003 | Beyne et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,603,183 B1 | 8/2003 | Hoffman |
| 6,606,251 B1 | 8/2003 | Kenny, Jr. et al. |
| 6,614,033 B2 | 9/2003 | Suguro et al. |
| 6,617,623 B2 | 9/2003 | Rhodes |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,661,047 B2 | 12/2003 | Rhodes |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,670,986 B1 | 12/2003 | Shoshan et al. |
| 6,680,459 B2 | 1/2004 | Kanaya et al. |
| 6,686,588 B1 | 2/2004 | Webster et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,864,172 B2 | 4/2004 | Noma et al. |
| 6,734,419 B1 | 5/2004 | Glenn et al. |
| 6,746,971 B1 | 6/2004 | Ngo et al. |
| 6,750,144 B2 | 6/2004 | Taylor |
| 6,756,564 B2 | 6/2004 | Tian |
| 6,759,266 B1 | 7/2004 | Hoffman |
| 6,770,958 B2 | 8/2004 | Wang et al. |
| 6,774,486 B2 | 8/2004 | Kinsman |
| 6,777,244 B2 | 8/2004 | Pepper et al. |
| 6,778,046 B2 | 8/2004 | Stafford et al. |
| 6,780,749 B2 | 8/2004 | Masumoto et al. |
| 6,790,775 B2 | 9/2004 | Fartash |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,809,025 B2 | 10/2004 | Sandhu et al. |
| 6,809,421 B1 | 10/2004 | Hayasaka et al. |
| 6,813,154 B2 | 11/2004 | Diaz et al. |
| 6,818,464 B2 | 11/2004 | Heschel et al. |
| 6,825,127 B2 | 11/2004 | Ouellet et al. |
| 6,825,458 B1 | 11/2004 | Moess et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,828,663 B2 | 12/2004 | Chen et al. |
| 6,828,674 B2 | 12/2004 | Karpman |
| 6,838,377 B2 | 1/2005 | Tonami et al. |
| 6,841,849 B2 | 1/2005 | Miyazawa |
| 6,844,978 B2 | 1/2005 | Harden et al. |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,021 B2 | 4/2005 | Boon et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,934,065 B2 | 8/2005 | Kinsman |
| 6,936,536 B2 | 8/2005 | Sinha |
| 6,943,056 B2 | 9/2005 | Nemoto |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa |
| 7,033,927 B2 | 4/2006 | Cohen et al. |
| 7,037,836 B2 | 5/2006 | Lee et al. |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,317,256 B2 | 1/2008 | Williams et al. |
| 7,491,582 B2 | 2/2009 | Yokoyama et al. |
| 7,498,661 B2 | 3/2009 | Matsuo |
| 2001/0020739 A1 | 9/2001 | Honda |
| 2002/0005583 A1 | 1/2002 | Harada et al. |
| 2002/0006687 A1 | 1/2002 | Lam |
| 2002/0020898 A1 | 2/2002 | Vu et al. |
| 2002/0027293 A1 | 3/2002 | Hoshino |
| 2002/0057468 A1 | 5/2002 | Segawa et al. |

| | | |
|---|---|---|
| 2002/0059722 A1 | 5/2002 | Murakami |
| 2002/0060208 A1 | 5/2002 | Liu et al. |
| 2002/0089025 A1 | 7/2002 | Chou |
| 2002/0094607 A1 | 7/2002 | Gebauer et al. |
| 2002/0096729 A1 | 7/2002 | Tu et al. |
| 2002/0113296 A1 | 8/2002 | Cho et al. |
| 2002/0130390 A1 | 9/2002 | Ker et al. |
| 2002/0145676 A1 | 10/2002 | Kuno et al. |
| 2002/0190371 A1 | 12/2002 | Mashino |
| 2003/0014895 A1 | 1/2003 | Lizotte |
| 2003/0042564 A1 | 3/2003 | Taniguchi et al. |
| 2003/0062601 A1 | 4/2003 | Harnden et al. |
| 2003/0119308 A1 | 6/2003 | Geefay et al. |
| 2003/0148597 A1 | 8/2003 | Tan et al. |
| 2003/0151144 A1 | 8/2003 | Muta et al. |
| 2003/0216023 A1 | 11/2003 | Wark et al. |
| 2004/0004280 A1 | 1/2004 | Shibata |
| 2004/0012698 A1 | 1/2004 | Suda et al. |
| 2004/0018712 A1 | 1/2004 | Plas et al. |
| 2004/0023447 A1 | 2/2004 | Hirakata et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0082094 A1 | 4/2004 | Yamamoto |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0214373 A1 | 10/2004 | Jiang et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0052751 A1 | 3/2005 | Liu et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0227382 A1 | 10/2005 | Hui |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0270651 A1 | 12/2005 | Boettiger et al. |
| 2005/0272221 A1 | 12/2005 | Yen et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0003566 A1 | 1/2006 | Emesh |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0071347 A1 | 4/2006 | Dotta |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0175532 A1 | 8/2006 | Boemler |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0281224 A1 | 12/2006 | Edelstein et al. |
| 2006/0281243 A1 | 12/2006 | Trezza |
| 2006/0289967 A1 | 12/2006 | Heck et al. |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |

| | | | |
|---|---|---|---|
| 2007/0020805 A1 | 1/2007 | Kim et al. | |
| 2007/0020935 A1 | 1/2007 | Taylor et al. | |
| 2007/0023121 A1 | 2/2007 | Jones et al. | |
| 2007/0032061 A1 | 2/2007 | Farnworth et al. | |
| 2007/0035033 A1 | 2/2007 | Ozguz et al. | |
| 2007/0037379 A1 | 2/2007 | Enquist et al. | |
| 2007/0042598 A1 | 2/2007 | Park | |
| 2007/0045120 A1 | 3/2007 | Tiwari et al. | |
| 2007/0045388 A1 | 3/2007 | Farnworth et al. | |
| 2007/0045515 A1 | 3/2007 | Farnworth et al. | |
| 2007/0045632 A1 | 3/2007 | Oliver et al. | |
| 2007/0045779 A1 | 3/2007 | Hiatt | |
| 2007/0045806 A1 | 3/2007 | Hsuan | |
| 2007/0045812 A1 | 3/2007 | Heng | |
| 2007/0045826 A1 | 3/2007 | Lee et al. | |
| 2007/0045834 A1 | 3/2007 | Chong et al. | |
| 2007/0045858 A1 | 3/2007 | Kirby et al. | |
| 2007/0048896 A1 | 3/2007 | Andry et al. | |
| 2007/0048994 A1 | 3/2007 | Tuttle | |
| 2007/0049016 A1 | 3/2007 | Hiatt et al. | |
| 2007/0049019 A1 | 3/2007 | Wai et al. | |
| 2007/0057028 A1 | 3/2007 | Lake et al. | |
| 2007/0077753 A1 | 4/2007 | Iwatake et al. | |
| 2007/0082427 A1 | 4/2007 | Shirahama et al. | |
| 2007/0096263 A1 | 5/2007 | Furukawa et al. | |
| 2007/0099395 A1 | 5/2007 | Sridhar et al. | |
| 2007/0111386 A1 | 5/2007 | Kim et al. | |
| 2007/0122940 A1 | 5/2007 | Gautham | |
| 2007/0138562 A1 | 6/2007 | Trezza | |
| 2007/0145563 A1 | 6/2007 | Punzalan et al. | |
| 2007/0152342 A1 | 7/2007 | Tsao et al. | |
| 2007/0155997 A1 | 7/2007 | Li et al. | |
| 2007/0158839 A1 | 7/2007 | Trezza | |
| 2007/0158853 A1 | 7/2007 | Sinha | |
| 2007/0161235 A1 | 7/2007 | Trezza | |
| 2007/0166991 A1 | 7/2007 | Sinha | |
| 2007/0166997 A1 | 7/2007 | Knorr | |
| 2007/0167004 A1 | 7/2007 | Trezza | |
| 2007/0170574 A1 | 7/2007 | Lauxtermann et al. | |
| 2007/0178694 A1 | 8/2007 | Hiatt | |
| 2007/0182020 A1 | 8/2007 | Trezza et al. | |
| 2007/0190803 A1 | 8/2007 | Singh et al. | |
| 2007/0197013 A1 | 8/2007 | Trezza | |
| 2007/0202617 A1 | 8/2007 | Hembree | |
| 2007/0222050 A1 | 9/2007 | Lee et al. | |
| 2007/0222054 A1 | 9/2007 | Hembree | |
| 2007/0228576 A1 | 10/2007 | Trezza | |
| 2007/0228926 A1 | 10/2007 | Teo et al. | |
| 2007/0262424 A1 | 11/2007 | Hiatt | |
| 2007/0267138 A1 | 11/2007 | White et al. | |
| 2007/0281473 A1 | 12/2007 | Clark et al. | |
| 2007/0293040 A1 | 12/2007 | Emesh et al. | |
| 2008/0006850 A1 | 1/2008 | Ribnicek et al. | |
| 2008/0050904 A1 | 2/2008 | Lake | |
| 2008/0050911 A1 | 2/2008 | Borthakur | |
| 2008/0054444 A1 | 3/2008 | Tuttle | |
| 2008/0057620 A1 | 3/2008 | Pratt | |
| 2008/0079120 A1 | 4/2008 | Foster et al. | |
| 2008/0079121 A1 | 4/2008 | Han | |
| 2008/0081386 A1 | 4/2008 | Raravikar et al. | |
| 2008/0081398 A1 | 4/2008 | Lee et al. | |
| 2008/0265933 A1 | 10/2008 | Tanioka et al. | |
| 2009/0007934 A1 | 1/2009 | Hutto | |
| 2009/0014859 A1 | 1/2009 | Jeung et al. | |
| 2009/0057912 A1 | 3/2009 | Kheng | |

FOREIGN PATENT DOCUMENTS

| | | | |
|---|---|---|---|
| EP | 0127946 A1 | 12/1984 | |
| EP | 0 886 323 | 12/1998 | |
| EP | 1 157 967 A2 | 11/2001 | |
| EP | 1154474 A1 | 11/2001 | |
| EP | 1415950 A2 | 5/2004 | |
| FR | 2 835 654 A1 | 8/2003 | |
| JP | 59-101882 A | 6/1984 | |
| JP | 59-191388 | 10/1984 | |
| JP | 63052432 A | 3/1988 | |
| JP | 02235589 A | 9/1990 | |
| JP | 07-263607 A | 10/1995 | |
| JP | 2001-077496 A | 3/2001 | |
| JP | 2001298147 A | 10/2001 | |
| JP | 2002018585 A | 1/2002 | |
| JP | 2005093980 A | 4/2005 | |
| JP | 2005310817 A | 11/2005 | |
| KR | 20010018694 | 3/2001 | |
| KR | 20020022122 A | 3/2002 | |
| KR | 20020061812 A | 7/2002 | |
| TW | 250597 B | 3/2006 | |
| WO | WO-90/05424 A1 | 5/1990 | |
| WO | WO-02/075815 A1 | 9/2002 | |
| WO | WO-02/095796 A2 | 11/2002 | |
| WO | WO-2004/054001 A2 | 6/2004 | |
| WO | 2004109770 A2 | 12/2004 | |
| WO | 2005022965 A2 | 3/2005 | |
| WO | 2005036940 A1 | 4/2005 | |
| WO | 2006053036 A2 | 5/2006 | |
| WO | 2006124597 A2 | 11/2006 | |
| WO | 2007025812 A1 | 3/2007 | |
| WO | 2007043718 A1 | 4/2007 | |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al., "Through Silicon Via and 3-D Wafer/Chip Stacking Technology," 2006 Symposium on VLSI Circuits, Digest of Technical Papers, pp. 89-92, IEEE, ISBN: 1-4244-006-6.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using M0RIO High Density Plasmas," presented at the 197th Meeting of the Electrochemical Society, Toronto 2000, <http://www.trikon.com/pdfs/ECS2b.pdf>.

Trigas, C., "System-In-Package or System-On-Chip?," EE Times, Sep. 19, 2003, <http://www.eetimes.com/story/OEG20030919S0049>.

Vereecken, P.M. et al., "The chemistry of additives in damascene copper plating," IBM J. Res. & Dev., vol. 49, No. 1, pp. 3-18, Jan. 2005.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

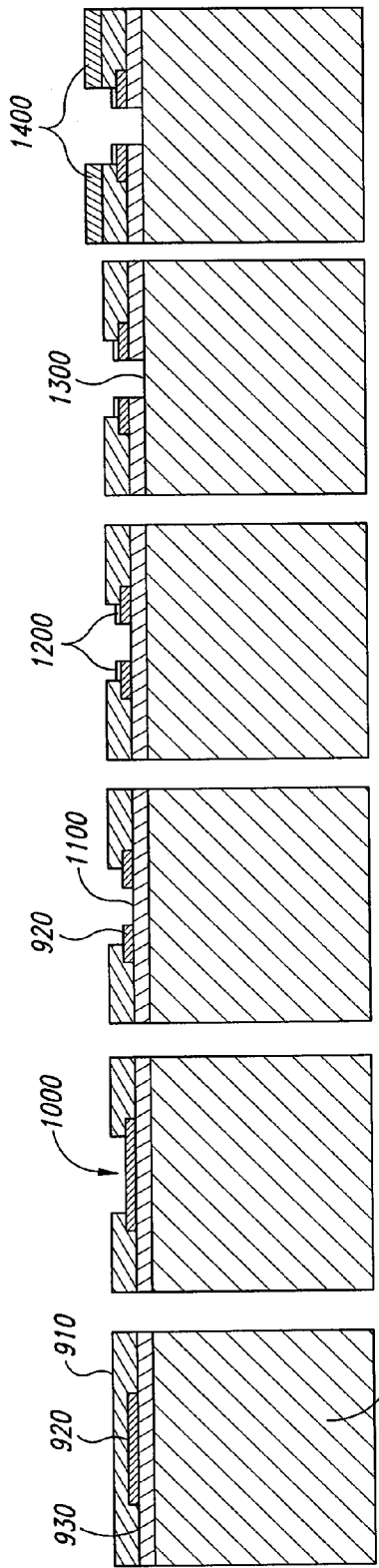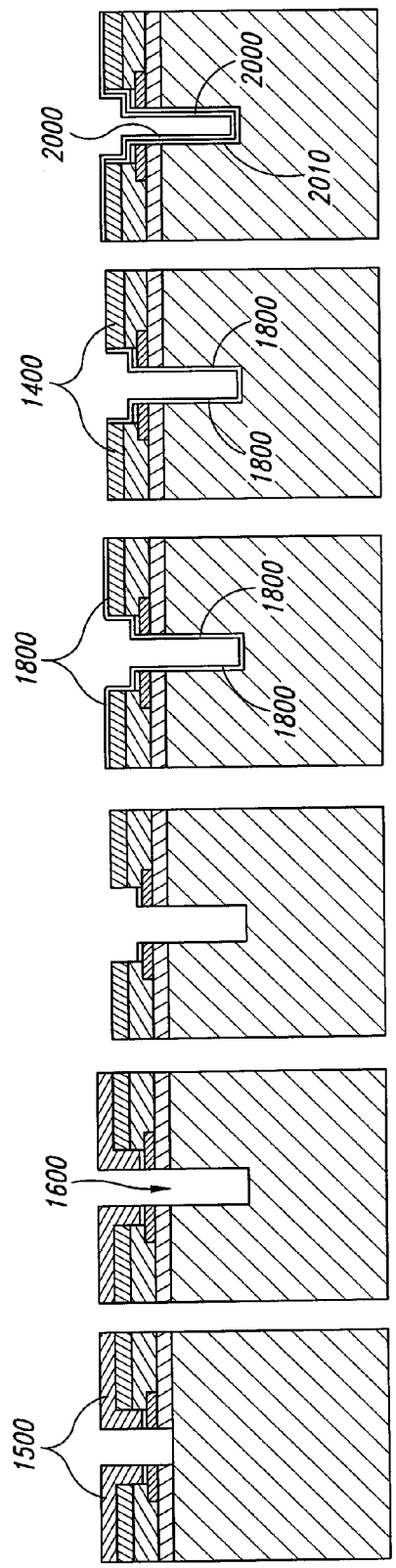

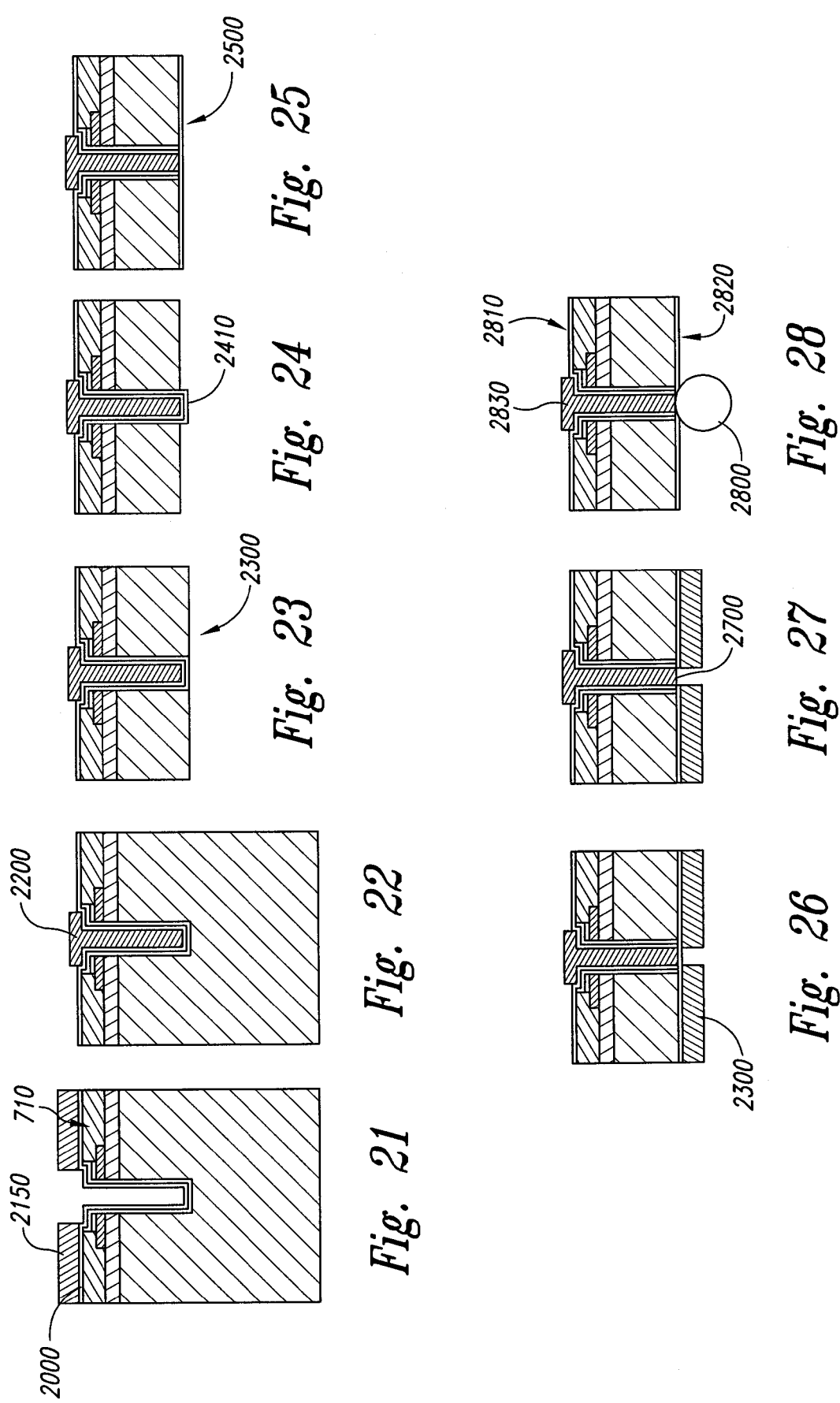

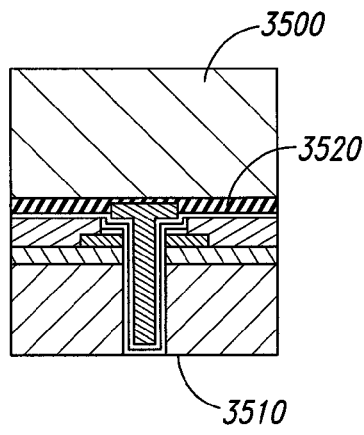
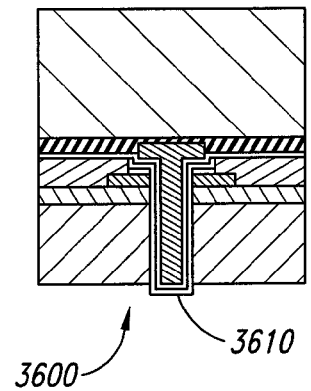
Fig. 29   Fig. 30
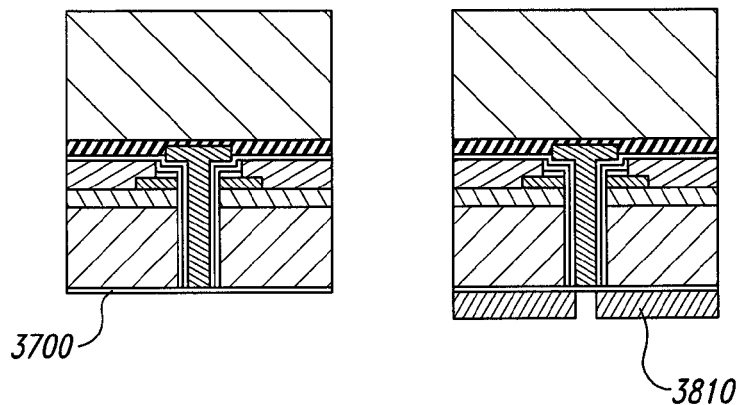
Fig. 31   Fig. 32   Fig. 33
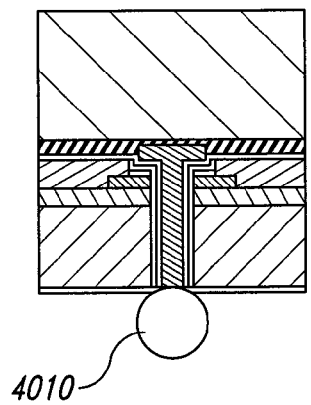
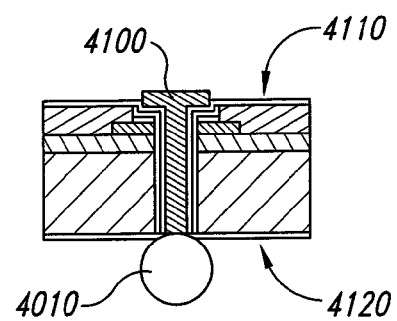
Fig. 34   Fig. 35

US 7,683,458 B2

THROUGH-WAFER INTERCONNECTS FOR PHOTOIMAGER AND MEMORY WAFERS

This application is a divisional of U.S. patent application Ser. No. 10/932,296 filed Sep. 2, 2004, now U.S. Pat. No. 7,300,857 issued Nov. 27, 2007, which is incorporated herein by reference in its entirety.

FIELD OF THE INVENTION

The present invention relates generally to imager and memory wafers, and more particularly to through-wafer interconnects and blind vias for imager and memory devices.

BACKGROUND OF THE INVENTION

As depicted in FIG. 1, a conventional bond pad structure 100 is built on a silicon substrate 110 covered by an oxide layer 120. The bond pad 130 is embedded within a passivation layer 140. A conductive gold wire (160) ball (150) bond is formed and attached on a central upper surface of the bond pad 130.

A disadvantage of direct bond pad connection on the top side of the die, as depicted in FIG. 1, includes the fact that they sometimes require a wire bond 160 to be electrically connected to a lead frame or other structure for final die packaging. Another method that involves flip chip packaging at the wafer level involves a re-distribution layer (RDL) that allows the bond pad pitch to be routed to a more useable pitch in order to attach a solder ball directly on the top side of the die. Both of these packaging approaches involve contacting the bond pads on the top side of the die. As a result, this limits the ability to stack memory and imager devices. Furthermore, the ability to attach the cover glass on imager wafers at the wafer level is limited due to the requirement to make contact to the bond pad on the top side of the wafer. Accordingly, it is desirable to develop a through-wafer interconnect to eliminate the need for wire bonding, to increase the volumetric circuit device density, to minimize the size of the die's packaging, to make memory devices stackable and to enable wafer level packaging (WLP) methods for imager wafers.

BRIEF SUMMARY OF THE INVENTION

The present invention addresses the shortcomings described above and provides in disclosed exemplary embodiments a through-wafer interconnect for imager, memory and other integrated circuit applications, thereby eliminating the need for wire bonding, making devices incorporating such interconnects stackable to allow increased volumetric density and device functionality and enabling WLP for imager devices. Further, a smaller and more reliable die package is achieved and circuit parasitics (e.g., L and R) are reduced due to the reduced signal path lengths.

BRIEF DESCRIPTION OF THE DRAWINGS

The above and other features and advantages of the invention will be more readily understood from the following detailed description of the invention which is provided in connection with the accompanying drawings, in which:

FIG. 9 depicts an initial portion of a process for manufacturing a blind via, in accordance with an exemplary embodiment of the invention;

FIG. 10 depicts a further portion of a process for manufacturing a blind via, in accordance with an exemplary embodiment of the invention;

FIG. 11 depicts a further portion of a process for manufacturing a blind via, in accordance with an exemplary embodiment of the invention;

FIG. 12 depicts a further portion of a process for manufacturing a blind via, in accordance with an exemplary embodiment of the invention;

FIG. 13 depicts a further portion of a process for manufacturing a blind via, in accordance with an exemplary embodiment of the invention;

FIG. 14 depicts a further portion of a process for manufacturing a blind via, in accordance with an exemplary embodiment of the invention;

FIG. 15 depicts a further portion of a process for manufacturing a blind via, in accordance with an exemplary embodiment of the invention;

FIG. 16 depicts a further portion of a process for manufacturing a blind via, in accordance with an exemplary embodiment of the invention;

FIG. 17 depicts a further portion of a process for manufacturing a blind via, in accordance with an exemplary embodiment of the invention;

FIG. 18 depicts a further portion of a process for manufacturing a blind via, in accordance with an exemplary embodiment of the invention;

FIG. 19 depicts a further portion of a process for manufacturing a blind via, in accordance with an exemplary embodiment of the invention;

FIG. 20 depicts a further portion of a process for manufacturing a blind via, in accordance with an exemplary embodiment of the invention;

FIG. 21 depicts a further portion of a process for manufacturing a blind via, in accordance with an exemplary embodiment of the invention;

FIG. 22 depicts a further portion of a process for manufacturing a blind via, in accordance with an exemplary embodiment of the invention;

FIG. 23 depicts a further portion of a process for manufacturing a blind via, in accordance with an exemplary embodiment of the invention;

FIG. 24 depicts a further portion of a process for manufacturing a blind via, in accordance with an exemplary embodiment of the invention;

FIG. 25 depicts a further portion of a process for manufacturing a blind via, in accordance with an exemplary embodiment of the invention;

FIG. 26 depicts a further portion of a process for manufacturing a blind via, in accordance with an exemplary embodiment of the invention;

FIG. 27 depicts a further portion of a process for manufacturing a blind via, in accordance with an exemplary embodiment of the invention;

FIG. 28 depicts a further portion of a process for manufacturing a blind via, in accordance with an exemplary embodiment of the invention;

FIG. 29 depicts a further portion of a process for manufacturing a blind via, in accordance with another exemplary embodiment of the invention;

FIG. 30 depicts a further portion of a process for manufacturing a blind via, in accordance with another exemplary embodiment of the invention;

FIG. 31 depicts a further portion of a process for manufacturing a blind via, in accordance with another exemplary embodiment of the invention;

FIG. 32 depicts a further portion of a process for manufacturing a blind via, in accordance with another exemplary embodiment of the invention;

FIG. 33 depicts a further portion of a process for manufacturing a blind via, in accordance with another exemplary embodiment of the invention;

FIG. 34 depicts a further portion of a process for manufacturing a blind via, in accordance with another exemplary embodiment of the invention; and FIG. 35 depicts a further portion of a process for manufacturing a blind via, in accordance with another exemplary embodiment of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
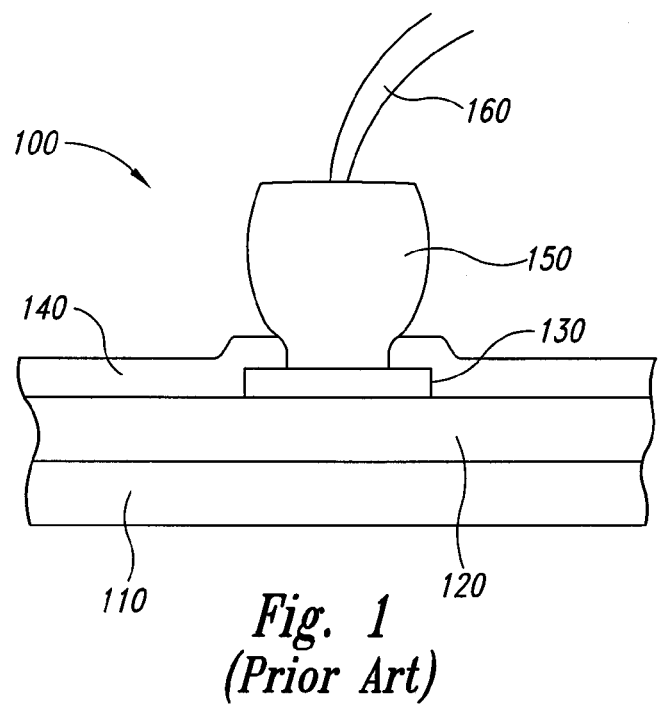
FIG. 1 depicts a conventional bond pad structure.
Figure 2:
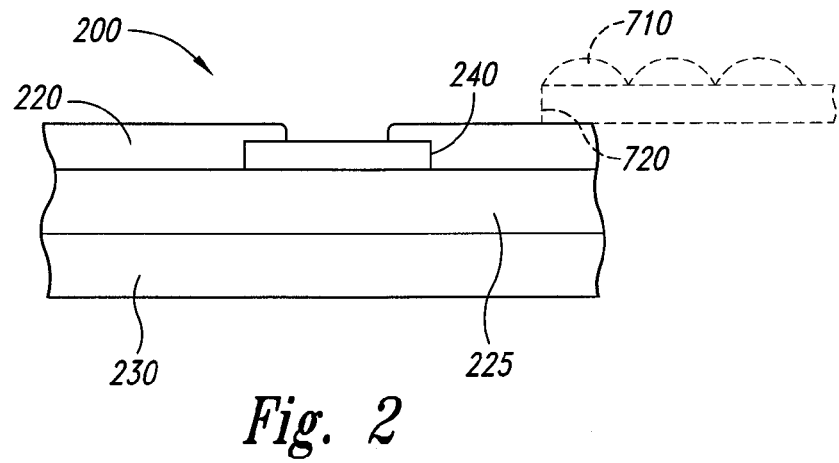
FIG. 2 depicts an initial portion of a process for manufacturing a through-wafer interconnect, in accordance with an exemplary embodiment of the invention.

FIG. 2 depicts a portion of a semiconductor wafer 200 at a stage of a process for manufacturing a through-wafer interconnect for an integrated circuit device. A bond pad 240 is depicted as being formed over a silicon (Si) substrate 230 and within a passivation layer 220 or layers. Beneath the passivation layer 220 is a borophosphosilicate glass (BPSG) layer 225. The bond pad 240 is depicted as being a monolithic structure, however, the bond pad 240 may take other forms including a multiple tiered structure. When the wafer 200 is an imager wafer, this portion of the process may be performed either prior to or after a color filter array (CFA) 720 and microlenses 710 (depicted in dotted lines) have been formed on the top surface of the wafer 200. One advantage to forming the interconnect prior to forming the CFA 720 and lenses 710 is that the CFA and lenses may be somewhat delicate and sensitive to heat; thus, forming the interconnect prior to their formation may result in less risk to damaging the array.

Figure 3:
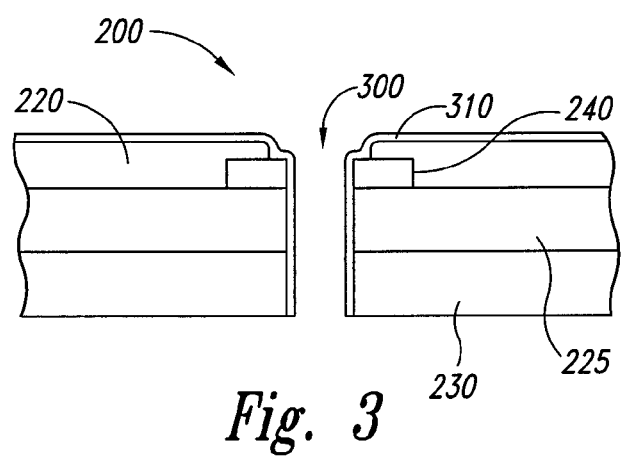
FIG. 3 depicts a further portion of a process for manufacturing a through-wafer interconnect, in accordance with an exemplary embodiment of the invention.

FIG. 3 depicts a hole, or via, 300 formed in a center of the bond pad 240 from the passivation layer 220 down through the substrate 230. The initial opening to create the hole 300 is formed by sequences of patterning and etching (either wet or dry) through the dielectric and metal layers. For instance, a dry etch may be performed to remove the top portion of passivation layer 220. A dry etch may be performed through the metal 240. A dry etch may be performed through the BPSG layer 225. A wet etch may be performed to form the initial hole 300 in the bulk silicon and to form an initial dimple in the Si 230. A laser drill process or deep silicon, dry etch process may then be conducted on the Si substrate 230, followed by a wet clean process. Also depicted is the application of a dielectric 310 to line the walls of the hole 300 and to electrically insulate the subsequent conductive materials in the via from shorting to the bulk silicon substrate. The dielectric also covers the top of the bond pad 240 and the upper passivation layer 220. The dielectric 310 may be low silane oxide (LSO) or any known method to deposit dielectric films using ALD, CVD, PECVD or other means commonly used in the art.

Figure 4:
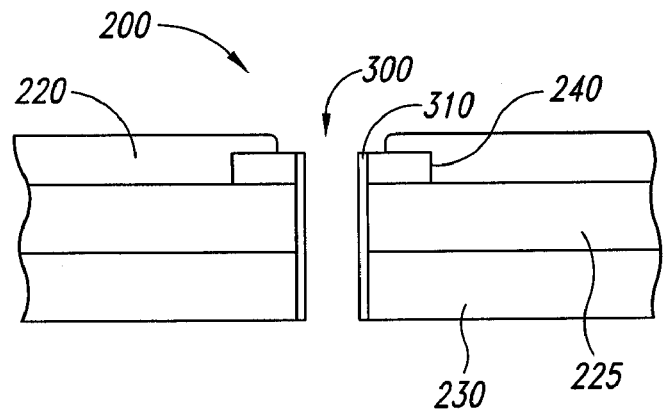
FIG. 4 depicts a further portion of a process for manufacturing a through-wafer interconnect, in accordance with an exemplary embodiment of the invention.

FIG. 4 depicts the interconnect structure with the dielectric 310 removed from the passivation layer 220 and the bond pad 240 by a spacer etch process (e.g., chemical mechanical polishing (CMP) or a dry vertical oxide etch). The dielectric 310 remains as a liner of the walls of the hole 300.

Figure 5:
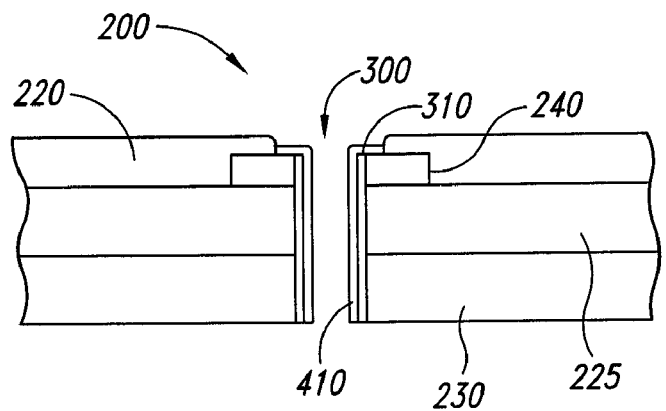
FIG. 5 depicts a further portion of a process for manufacturing a through-wafer interconnect, in accordance with an exemplary embodiment of the invention.

FIG. 5 depicts a plating layer 410 of nickel on a seed material such as titanium nitride (TiN) or tungsten (W), or copper (Cu) on tantalum (Ta), or copper (Cu) on tungsten (W), or other conductive materials and other combinations of these materials, deposited on top of the dielectric 310 on the sidewalls of the via 300 and on top of a portion of the bond pad 240. The seed material or materials are removed from the top passivation surface by CMP or photo/etch processing. This removal process does not remove the material in the via or on the bond pad.

Figure 6:
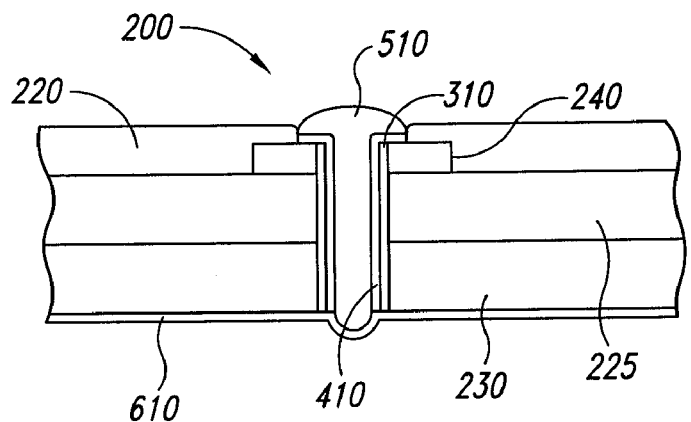
FIG. 6 depicts a further portion of a process for manufacturing a through-wafer interconnect, in accordance with an exemplary embodiment of the invention.

FIG. 6 depicts the hole 300 as being filled with solder 510 utilizing plating or molten solder. It should be noted that other conductive materials (e.g., copper, nickel, conductive polymers, etc.) may be used to fill the hole 300 and/or conductive materials may also be plated to fill the hole. (e.g., nickel, copper, etc.). A dielectric layer 610 is then applied to the lower surface of the wafer 200.

Figure 7:
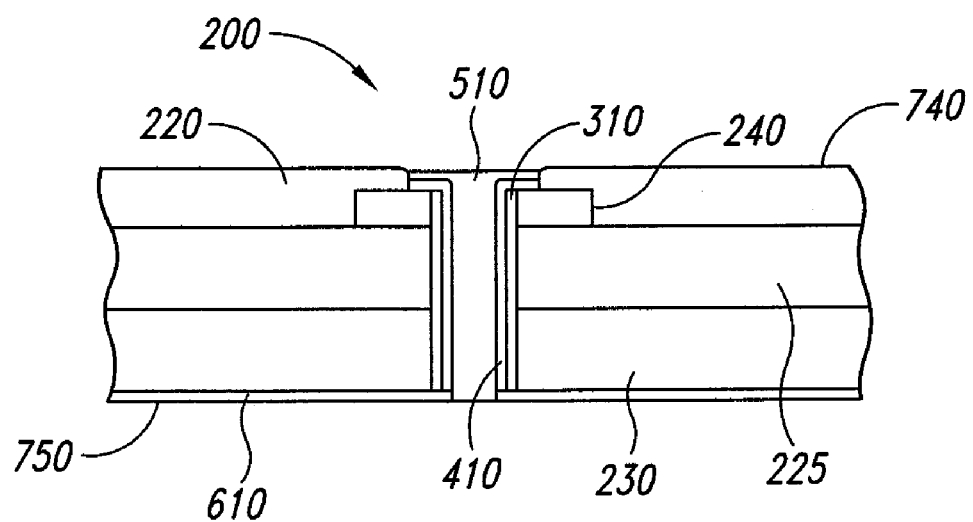
FIG. 7 depicts a further portion of a process for manufacturing a through-wafer interconnect, in accordance with an exemplary embodiment of the invention.
Figure 8:
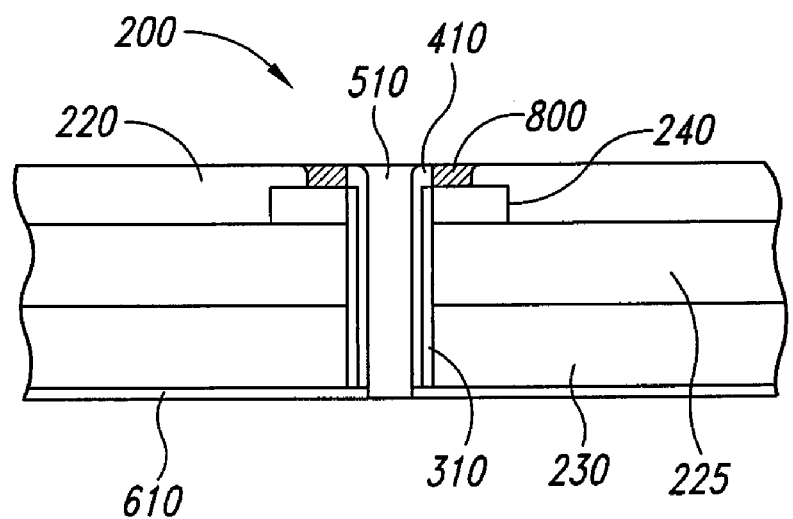
FIG. 8 depicts a further portion of a process for manufacturing a through-wafer interconnect, in accordance with an exemplary embodiment of the invention.

As depicted in FIG. 7, a CMP process may then be performed on the top surface 740 and the bottom surface 750. Another variation of the process is to use a wet etch rather then CMP to etch away the protruding solder 510 or nickel plating 800 (FIG. 8). It should be noted that the CMP process may not be necessary for memory device applications as the final surface topography may not be critical. For an imager wafer, the CFA 720 and lenses 710 are then formed on top of the upper flat surface 740. Performing a planarization process after the solder 510 fill operation helps to provide a smooth surface in which to apply the CFA and microlens material. The smooth wafer surface prevents streaking and other imperfections which can affect the optical performance of the CFA and microlens structures.

In accordance with an exemplary embodiment of the invention, the via 510 electrically connects bond pad 240 with the top surface 740 of the wafer and the bottom surface 750 of the wafer resulting in a much more efficient package that is stackable for memory devices and that lends itself to wafer level packaging for imager devices.

FIG. 8 depicts another exemplary embodiment in which the nickel plating 800 is flush with the passivation layer 220. In this embodiment, the top metal layer of the bond pad 240 is plated with nickel. In this manner, when the solder 510 filling the hole 300 is planarized by CMP, the nickel remains at the top-most portion of the through-wafer interconnect.

Turning to FIG. 9, an initial step in another exemplary process for forming a through-wafer interconnect with a blind via is depicted. An initial step in this exemplary process is to form a blind via that recesses only partially through a semiconductor substrate. A simplified illustration of a completed wafer is depicted as containing a silicon substrate 900 and a bond pad 920 provided near an upper surface which is surrounded by a passivation layer 910. The passivation layer 910 is located above an insulation layer, such as BPSG layer 930. As depicted in FIG. 10, the passivation layer is removed from an area over a portion of bond pad 920, by a dry etch process up to the bond pad 920 leaving an opening 1000 in the passivation layer.

As depicted in FIG. 11, a wet or dry metal etch is performed through the bond pad 920 down to surface 1100 of the BPSG layer 930. FIG. 12 depicts a nickel plating 1200 formed on the bond pad 920. An oxide etch is performed on the lower passivation layer and down to the top layer 1300 of the silicon substrate 900, as depicted in FIG. 13. FIG. 14 depicts the optional application of a polyimide coat 1400 to planarize and protect the frontside of the wafer from residual metals on the vertical surfaces of the wafer topography. These residual metals are formed when material is not sufficiently removed in previous CMP or wet or dry etch processing.

As depicted in FIG. 15, a resist coat 1500 is applied for performing a deep silicon etch. The results of the etch are depicted in FIG. 16 in which a via 1600 approximately 150-300 micrometers deep has been etched. The deep silicon etch resist coat 1500 is then stripped, as depicted in FIG. 17. FIG. 18 depicts the deposition of a dielectric material 1800 on the via 1600 sidewalls and other surfaces. The dielectric 1800 serves as an electrical insulation layer for the sidewalls. In FIG. 19, results of a spacer dry etch are depicted as having removed the dielectric from the surface 1400, but maintaining the dielectric 1800 on the via sidewalls.

Turning to FIG. 20, a seed layer of conductive material is formed on the dielectric and on the metal bond pads through processes known in the art such as e.g., CVD, PECVD, PVD. In FIG. 21, the seed layer is covered with photoresist 2150 to protect the surface from subsequent plating steps. Electroless or electrolytic nickel plating 2000 is depicted on the sidewalls 2010 of the via 1600 and also on the top portion of the bond pad 920. In the optional flow of using polyimide 1400, the polyimide 1400 may be stripped from the surface of the passivation layer 910 (FIG. 21). The via 1600 is filled with conductive material such as solder 2200 utilizing plating or molten solder as depicted in FIG. 22. FIG. 23 depicts a thinned wafer 2300 having been processed by backgrind, CMP, wet etch, dry etch, or any other thinning method known in the art.

FIG. 24 depicts an optional tetramethylammonium hydroxide (TMAH) silicon etch that exposed the dielectric 2410 on the bottom side of the via and causes the via insulation and via fill material to slightly protrude out from the backside surface. Regardless of whether the TMAH etch is performed, a dielectric deposition is applied to passivate the backside 2500 of the wafer, as illustrated in FIG. 25. With the via protruding in the manner described, CMP or a wet etch may be performed across the entire backside of the wafer in order to remove the insulating material covering the solder while maintaining a passivation layer over bulk silicon regions of the backside of the wafer.

As an alternate embodiment to CMP exposure of the solder on the backside of the wafer, turning to FIG. 26, a resist 2600 is applied to the backside of the wafer and in FIG. 27, the lower level of passivation is removed by applying a photo pattern and performing a wet oxide etch or dry spacer etch to expose the lower layer of solder 2700. The resist is stripped and a solder ball 2800 may be attached to the bottom of the via 1600, as depicted in FIG. 28. Alternatively, a solder ball 2800 could be attached to the top of the via 1600, or a solder ball 2800 could be attached to both the top and the bottom, or not attached at all.

As depicted in FIG. 28, a through-wafer interconnect 2830 is formed in which the interconnect 2830 extends from a topside surface 2810 of the wafer where it is electrically connected to a bond pad 920, to a bottomside surface 2820 of the wafer and in which a solder ball 2800 is attached and electrically connected to the bottomside surface of the interconnect 2830. As a result, the interconnect 2830 is actually part of the structure of the device or circuit included within the wafer and is more reliable, due to shorter connections and fewer parts, enabling a subsequent packaging size of the die to be greatly reduced and allowing die to be stacked with no wire bonding.

Turning to FIGS. 29-35, a second exemplary process for forming a blind via is depicted. The beginning of the second exemplary process is identical to the portions of the first exemplary process depicted above in connection with FIGS. 9-22 The process continues at FIG. 29, as described below.

FIG. 29 depicts a carrier 3500 bonded to the upper layer of the wafer with a carrier bonding adhesive 3520 and the wafer is thinned to surface 3510 though any thinning process known in the art. The carrier material could be a substrate such as silicon, glass, silicon nitride, aluminum nitride, or any other material suitable for use as a carrier substrate. The adhesive can be photoresist, photo-definable epoxy, an adhesive tape medium, UV releasable tape, etc. A TMAH silicon etch may be optionally performed to expose the via 3610 at the bottom of the via and cause it to slightly protrude from the surface, as depicted in FIG. 30.

FIG. 31 depicts a dielectric deposition 3700 to passivate the backside of the wafer and FIG. 32 depicts a resist and pattern 3810 applied to the backside of the wafer to prepare for an etch process on the backside. A wet passivation etch or dry spacer etch is performed to remove the backside passivation 3700 from the solder via 3900, as depicted at FIG. 33. This may also be accomplished with a light CMP or grind operation which leaves passivation material over the bulk silicon while allowing the solder to be exposed on the backside of the filled via. FIG. 34 depicts the removal of the resist 3810 and the application of solder ball 4010. FIG. 35 depicts removal of the carrier 3500.

Here again, a through-wafer interconnect 4100 is formed in which the interconnect 4100 extends from a topside surface 4110 of the wafer, where it is electrically connected to a bond pad 920, to a bottomside surface 4120 of the wafer and in which a solder ball 4010 is attached and electrically connected to the interconnect 4100. The interconnect is part of the structure of the device or circuit included within a die and is more reliable, due to fewer connections and external parts, enabling a subsequent packaging size of a die to be greatly reduced.

In accordance with exemplary embodiments of the invention, packaging solutions are described which eliminate wire bonding to bond pads. As a result, die performance and reliability are enhanced. Furthermore, these processes result in much smaller die packages which may be stacked and which lend themselves to WLP. Packaging costs are also significantly reduced as a result.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the processes are described in a specific order, some of the process steps may be performed in an order different than that described above. Further, while the processes are described in connection with imager and memory wafers, the invention is not limited to such applications. The invention may be practiced with other types of wafers as well as any device that would benefit from such a through-wafer interconnect. Accordingly, the invention is not limited by the foregoing description or drawings, but is only limited by the scope of the appended claims.

What is claimed as new and desired to be protected by Letters Patent of the United States is:

1. A wafer comprising:
   an electrically conductive interconnect extending from a frontside surface of the wafer to a backside surface of the wafer, wherein at least the frontside surface is substantially flat, and wherein the electrically conductive interconnect comprises
      a hole formed through a bond pad in the wafer, the hole extending from the frontside surface of the wafer to the backside surface of the wafer;
      a dielectric disposed on a sidewall of the hole;
      a first conductive material disposed on the dielectric, wherein the first conductive material contacts the bond pad; and
      a second conductive material filling the hole, wherein the second conductive material extends from the frontside surface to the backside surface and is electrically coupled to the bond pad via the first conductive material, and wherein the second conductive material is co-planar or recessed with respect to the frontside surface and surrounded by a dielectric passivation material at the frontside surface.

2. The wafer of claim 1, wherein the dielectric comprises a low silane oxide.

3. The wafer of claim 1, wherein the first conductive material comprises a layer of nickel on one of titanium nitride and tungsten.

4. The wafer of claim 1, wherein the first conductive material comprises a layer of copper on tantalum.

5. The wafer of claim 1, wherein the first conductive material comprises a layer of copper on tungsten.

6. The wafer of claim 1, wherein the second conductive material comprises solder.

7. The wafer of claim 1, wherein the second conductive material comprises copper.

8. The wafer of claim 1, wherein the second conductive material comprises nickel plating.

9. The wafer of claim 1, wherein the second conductive material comprises copper plating.

10. The wafer of claim 1, further comprising a layer of nickel disposed on the bond pad along an outer edge of the hole, the layer of nickel extending from the frontside surface of the wafer to the bond pad.

11. The wafer of claim 1, further comprising an electrically conductive ball electrically coupled to the interconnect on at least one of the frontside surface and the backside surface.

12. The wafer of claim 1 wherein each of the frontside and backside surfaces is a substantially flat surface resulting from a chemical mechanical polish after the second conductive material fills the hole.

13. A wafer comprising:
   an electrically conductive interconnect extending from a frontside surface of the wafer to a backside surface of the wafer, wherein at least the frontside surface is substantially planar, and wherein the electrically conductive interconnect comprises
      a via extending through the wafer from the frontside surface to the backside surface;
      a dielectric layered on a sidewall of the via;
      a first conductive material layered on the dielectric and contacting a bond pad; and
      a second conductive material filling the via, wherein the second conductive material extends from the frontside surface to the backside surface and is electrically coupled to the bond pad through the first conductive material, and wherein the second conductive material is co-planar or recessed with respect to the frontside surface and surrounded by a dielectric passivation layer; and
   a conductive ball electrically coupled to the bond pad through the interconnect.

14. The wafer of claim 13, wherein the conductive ball comprises a solder ball.

15. A wafer comprising:
   an electrically conductive interconnect extending from a first surface of the wafer to a second surface of the wafer opposite the first surface, wherein the electrically conductive interconnect comprises
      a hole formed through a bond pad in the wafer, the hole extending from the first surface of the wafer to the second surface of the wafer;
      a dielectric coating on a sidewall of the hole;
      a first conductive material disposed on the dielectric coating and contacting the bond pad; and
      a second conductive material filling the hole, wherein the second conductive material extends from the first surface to the second surface and is electrically coupled to the bond pad via the first conductive material, and wherein the second conductive material is co-planar or recessed with respect to the first surface and surrounded by a dielectric passivation material at the first surface, and wherein each of the first and second surfaces is a substantially flat surface that is formed after the second conductive material fills the hole; and
   a conductive member electrically coupled to the bond pad via the interconnect.

16. The wafer of claim 15 wherein the conductive member is a solder ball coupled to the interconnect at the second surface of the wafer.

17. The wafer of claim 15 wherein the first surface is planarized by a chemical mechanical polish after the second conductive material fills the hole.

* * * * *